United States Patent
Song et al.

(10) Patent No.: US 10,283,628 B2
(45) Date of Patent: May 7, 2019

(54) THIN FILM TRANSISTOR WITH SOURCE ELECTRODE, DRAIN ELECTRODE AND ACTIVE LAYER PREPARED IN A SAME LAYER AND METHOD FOR MANUFACTURING THE SAME, ARRAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Botao Song, Beijing (CN); Liang Lin, Beijing (CN); Zhixiang Zou, Beijing (CN); Yinhu Huang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/905,086

(22) PCT Filed: Sep. 11, 2015

(86) PCT No.: PCT/CN2015/089424
§ 371 (c)(1),
(2) Date: Jan. 14, 2016

(87) PCT Pub. No.: WO2016/123979
PCT Pub. Date: Aug. 11, 2016

(65) Prior Publication Data
US 2016/0372581 A1 Dec. 22, 2016

(30) Foreign Application Priority Data
Feb. 2, 2015 (CN) .......................... 2015 1 0054532

(51) Int. Cl.
*H01L 29/10* (2006.01)
*H01L 29/66* (2006.01)
(Continued)

(52) U.S. Cl.
CPC .. *H01L 29/66969* (2013.01); *H01L 21/02565* (2013.01); *H01L 21/02614* (2013.01);
(Continued)

(58) Field of Classification Search
CPC .................... H01L 29/66969; H01L 21/02565
(Continued)

(56) References Cited

U.S. PATENT DOCUMENTS

| 7,468,304 B2 * | 12/2008 | Kaji | H01L 21/02554 |
| | | | 438/149 |
| 8,679,905 B2 * | 3/2014 | Shieh | H01L 21/428 |
| | | | 257/E21.618 |

(Continued)

FOREIGN PATENT DOCUMENTS

| CN | 102194893 A | 9/2011 |
| CN | 102280490 A | 12/2011 |

(Continued)

OTHER PUBLICATIONS

First Chinese Office Action dated Feb. 3, 2017; Appln. No. 201510054532.8.
(Continued)

*Primary Examiner* — Caleb E Henry
(74) *Attorney, Agent, or Firm* — Ladas & Parry LLP

(57) ABSTRACT

A thin film transistor and manufacturing method thereof, an array substrate and a display device are disclosed. The thin film transistor includes a source electrode, a drain electrode and an active layer; the source electrode, the drain electrode and the active layer are disposed in a same layer, the source electrode and the drain electrode are separately joined to the (Continued)

active layer through their respective side faces, a material of the source electrode and the drain electrode is metal, and a material of the active layer is a metal oxide semiconductor in correspondence with material of the source electrode and the drain electrode. With the thin film transistor, procedures can be decreased, thereby reducing costs.

9 Claims, 4 Drawing Sheets

(51) Int. Cl.
    *H01L 21/02*     (2006.01)
    *H01L 21/383*     (2006.01)
    *H01L 29/786*     (2006.01)
    *H01L 29/417*     (2006.01)
    *H01L 27/12*     (2006.01)
    *H01L 29/45*     (2006.01)

(52) U.S. Cl.
    CPC ........ *H01L 21/383* (2013.01); *H01L 27/1288* (2013.01); *H01L 29/41733* (2013.01); *H01L 29/45* (2013.01); *H01L 29/7869* (2013.01); *H01L 29/78696* (2013.01)

(58) Field of Classification Search
    USPC .......................................................... 257/43
    See application file for complete search history.

(56) References Cited

U.S. PATENT DOCUMENTS

| | | | | |
|---|---|---|---|---|
| 8,877,533 B2* | 11/2014 | Choi | ................. | H01L 29/66969 438/104 |
| 9,048,322 B2* | 6/2015 | Lee | ................... | H01L 29/66969 |
| 9,129,992 B2* | 9/2015 | Zhang | | |
| 9,252,284 B2* | 2/2016 | Lee | ..................... | H01L 29/7869 |
| 9,252,285 B2* | 2/2016 | Seo | ................... | H01L 29/66969 |
| 9,397,221 B2* | 7/2016 | Su | ..................... | H01L 21/02565 |
| 9,515,100 B2* | 12/2016 | Im | ..................... | H01L 21/02532 |
| 2009/0261389 A1 | 10/2009 | Cho et al. | | |
| 2010/0072435 A1* | 3/2010 | Honda | ..................... | H01B 1/22 252/519.51 |
| 2010/0163868 A1 | 7/2010 | Yamazaki et al. | | |
| 2012/0262642 A1 | 10/2012 | Ikeda et al. | | |
| 2014/0011329 A1* | 1/2014 | Zhang | ............... | H01L 29/66969 438/158 |
| 2014/0061632 A1 | 3/2014 | Lee et al. | | |
| 2014/0061633 A1* | 3/2014 | Wang | ................ | H01L 21/02172 257/43 |
| 2014/0071364 A1* | 3/2014 | Liu | ........................ | G02F 1/1362 349/43 |
| 2014/0339537 A1* | 11/2014 | Bae | ................... | H01L 29/78636 257/43 |
| 2015/0137113 A1* | 5/2015 | Yu | ........................ | H01L 29/7869 257/43 |
| 2015/0179679 A1* | 6/2015 | Im | ..................... | H01L 21/02532 257/43 |
| 2015/0194475 A1* | 7/2015 | Kawashima | ........ | H01L 29/7869 257/40 |
| 2015/0221775 A1* | 8/2015 | Yamazaki | ........... | H01L 29/7869 257/43 |
| 2015/0249161 A1* | 9/2015 | Su | ..................... | H01L 21/02565 257/43 |
| 2015/0270406 A1* | 9/2015 | Sun | ................... | H01L 29/78606 257/29 |
| 2015/0280002 A1* | 10/2015 | Lu | ........................ | H01L 29/7869 257/43 |
| 2015/0295091 A1* | 10/2015 | Cao | ........................ | G02F 1/1368 257/43 |
| 2016/0027818 A1 | 1/2016 | Yoo et al. | | |
| 2016/0043227 A1* | 2/2016 | Zhang | ................. | H01L 29/7869 257/43 |
| 2016/0233338 A1* | 8/2016 | Lu | ........................ | H01L 29/7869 |
| 2016/0293716 A1 | 10/2016 | Wu et al. | | |

FOREIGN PATENT DOCUMENTS

| | | |
|---|---|---|
| CN | 102576507 A | 7/2012 |
| CN | 103681690 A | 3/2014 |
| CN | 103715094 A | 4/2014 |
| CN | 103915509 A | 7/2014 |
| CN | 104282576 A | 1/2015 |
| CN | 104299915 A | 1/2015 |
| CN | 104576760 A | 4/2015 |
| JP | 08264794 A | 10/1996 |
| JP | 3479375 B2 | 12/2003 |
| KR | 20140007515 A | 1/2014 |

OTHER PUBLICATIONS

The Extended European Search Report dated Aug. 6, 2018; Appln. No. 15832673.6.
The Second Chinese Office Action dated Sep. 29, 2017; Appln. 201510054532.8.
International Search Report and Written Opinion both dated Nov. 3, 2015; PCT/CN2015/089424.

* cited by examiner

THIN FILM TRANSISTOR WITH SOURCE ELECTRODE, DRAIN ELECTRODE AND ACTIVE LAYER PREPARED IN A SAME LAYER AND METHOD FOR MANUFACTURING THE SAME, ARRAY SUBSTRATE AND DISPLAY DEVICE

TECHNICAL FIELD

At least an embodiment of the present invention relates to a thin film transistor and a method for manufacturing the same, an array substrate and a display device.

BACKGROUND

Generally, in the technology regarding oxide semiconductor thin film transistor (TFT), a back channel etch (BCE) structure or an etch stop layer (ESL) structure is employed for forming a metal oxide semiconductor TFT, and a mask process and an etching treatment process need to be conducted separately for both an active layer and source and drain electrodes. Consequently, this requires a relatively long process time for manufacturing a TFT, a relatively large step, and a relatively high cost.

SUMMARY

According to at least an embodiment of the present invention, there are provided a thin film transistor and manufacturing method thereof, an array substrate and a display device, so as to overcome the aforementioned technical problems.

According to at least an embodiment of the present invention, there is provided a thin film transistor, comprising a source electrode, a drain electrode and an active layer; the source electrode, the drain electrode and the active layer are disposed in the same layer, the source electrode and the drain electrode are separately joined to the active layer through their respective side faces, a material of the source electrode and the drain electrode is metal, and a material of the active layer is a metal oxide semiconductor in correspondence with the material of the source electrode and the drain electrode.

For example, the source electrode, the drain electrode and the active layer are prepared by the same layer of a metal thin film, and the metal oxide semiconductor is obtained by oxidizing the metal thin film.

For example, when the material of the source electrode and the drain electrode is selected, it should be noted that the material must be able to be formed into an oxide semiconductor by a subsequent process. The metal may be a monolayer or a stack of any one or more of the metals selected from the group consisting of indium (In), gallium (Ga), zinc (Zn), tin (Sn), molybdenum (Mo) or tungsten (W) or an alloy thereof. Further, for example, the metal may be replaced by other metal for forming the active layer and source and drain electrodes.

For example, the thin film transistor may further include a gate electrode and a gate insulating layer, the gate insulating layer is disposed on the gate electrode, and the source electrode, the drain electrode and the active layer arranged in the same layer are disposed on the gate insulating layer.

For example, the stated thin film transistor may further include a gate electrode and a gate insulating layer, the gate insulating layer is disposed on the source electrode, the drain electrode and the active layer, and the gate electrode is disposed on the gate insulating layer.

According to an embodiment of the invention, there is further provided a manufacturing method of a thin film transistor, comprising a step of forming a source electrode, a drain electrode and an active layer lying in the same layer, wherein, the step of forming the source electrode, the drain electrode and the active layer lying in the same layer includes: forming a metal thin film, forming a pattern of the source electrode, the drain electrode and the active layer by the metal thin film, forming a stop layer to cover a source region and a drain region, and to expose an active layer region, converting part or all of the metal in the active layer region into a metal oxide semiconductor, and removing the stop layer in the source region and the drain region, thereby forming the source electrode, the drain electrode and the active layer eventually.

For example, the material of the metal thin film may be a monolayer or a stack of any one or more of the metals selected from the group consisting of indium, gallium, zinc, tin, molybdenum or tungsten or any alloy thereof. When the material of the source electrode and the drain electrode is selected, it should be noted that the material must be able to be formed into an oxide semiconductor by a subsequent process. Further, for example, the metal may be replaced by other metal for forming the active layer and source and drain electrodes.

For example, the pattern of the source electrode, the drain electrode and the active layer is formed by the metal thin film with the same pattering process.

For example, photoresist may be used for the stop layer. Certainly, other material usable for preventing the metal from being converted into a metal oxide may also be useful for covering.

For example, when photoresist is used as the stop layer to cover the source region and the drain region, a half-tone or gray-tone mask method may be adopted to simultaneously form the pattern of the source electrode, the drain electrode and the active layer and to distinguish the source region and the drain region that are required to be covered and the active layer region that is required to be exposed (namely, to distinguish a zone that is required to be oxidized and zones that are not required to be oxidized).

For example, part or all of the metal in the active layer region may be converted into a metal oxide semiconductor by means of heat treatment, but the converting treatment is not limited to heat treatment. Rather, other method may also be adopted if the metal can be converted into a metal oxide semiconductor by the method.

For example, the heat treatment is conducted under oxygen atmosphere. Further, the heat treatment mode may be as follows: the heat treatment may be carried out under an oxygen gas atmosphere, and the heat treatment may also be carried out under a nitrogen gas or inert gas atmosphere, which contains oxygen gas.

For example, the manufacturing method of the thin film transistor further includes steps of forming a gate electrode and a gate insulating layer.

According to at least an embodiment of the invention, there is further provided an array substrate, which includes any one of the above-mentioned thin film transistors.

According to at least an embodiment of the invention, there is further provided a display device, which includes any one of the above-mentioned array substrates.

For example, the display device includes a liquid crystal display device, an organic light emitting diode display device or an electronic paper display device.

BRIEF DESCRIPTION OF THE DRAWINGS

In order to illustrate the technical solution of the embodiments of the invention more clearly, the drawings of the embodiments will be briefly introduced below; it is obvious that the drawings as described below are only related to some embodiments of the invention, but not imitative of the invention.

FIG. 2a is about formation of a metal thin film; FIG. 2b is about simultaneous formation of pattern of a source electrode, a drain electrode and an active layer by the metal thin film; FIG. 2c is about formation of a stop layer covering a source region and a drain region, with an active layer region being exposed; FIG. 2d is about formation of the source electrode, the drain electrode and the active layer;

FIG. 3a is about formation of a metal thin film; FIG. 3b is about formation of photoresist on the metal thin film; FIG. 3c is about conduction of exposure and development on the photoresist with a dual-tone mask process; FIG. 3d is about formation of a stop layer 7 by removing the photoresist with a smaller thickness through an asking process, with the metal thin film in an active layer region 3a being exposed, and with a source region 1a and a drain region 2a being covered by the stop layer 7;

REFERENCE NUMERALS

Figure 1A:
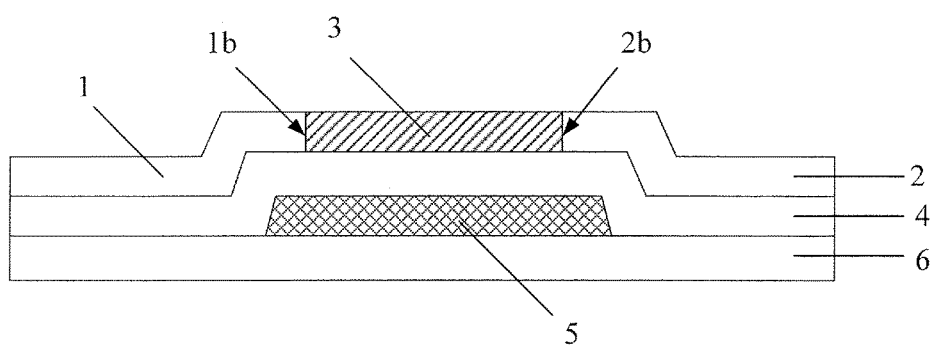
FIG. 1a is a first schematic view illustrating a thin film transistor according to an embodiment of the invention.

1—source electrode; 2—drain electrode; 3—active layer; 4—gate insulating layer; 5—gate electrode; 6—substrate; 7—stop layer; 8—photoresist; 9—passivation layer; 10—pixel electrode; 11—protective layer; 30—metal thin film; 1a—source region; 2a—drain region; 3a—active layer region; 8a—photoresist with a larger thickness; 8b—photoresist with a smaller thickness; 30a—pattern of a source electrode, a drain electrode and an active layer; 1b—side face of a source electrode; 2b—side face of a drain electrode

DESCRIPTION OF THE PREFERRED EMBODIMENTS

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

It shall be understood that, in the present disclosure, "same layer" refers to a layer structure that is formed by same one patterning process with the same mask after a film layer for forming a specific pattern is formed by using same one film forming process. That is, one patterning process corresponds to one mask (also called as photomask). As for different specific patterns, one patterning process may include plural processes of exposure, development or etching, while the formed specific pattern in the layer structure may be continuous or discontinuous, and the specific pattern may further be at different heights or have different thicknesses.

For the sake of clarity, in drawings for illustrating embodiments of the present invention, the thickness of layers or regions is magnified. It is understandable that when an element such as a layer, film, region, or substrate is referred to as being "disposed", "formed" (or a similar term) "on" another element, it can be "directly" disposed or formed "on" the other element, or intervening elements may also be present.

The present disclosure will be mainly described in detail by taking a bottom-gate type thin film transistor as an example, but the thin film transistor in the present disclosure may also be of a top-gate type, a dual-gate type or the like. The protection scope of the present invention is not limited to these specific structures.

In the present disclosure, a source electrode, a drain electrode and an active layer that are disposed in a same layer and a manufacturing method for the structure will be mainly described in detail, and other elements and the manufacture process thereof can be referred to the usual manufacturing method if there is no relevant descriptions.

A semiconductor device and a manufacturing method thereof are disclosed by a patent application document CN 102194893A (application number: 201110144092.7), and an example of the manufacturing process in which a first thin film transistor 430 for a driving circuit and a second thin film transistor 170 for a pixel portion (also called as a matrix circuit) are formed on the same substrate is disclosed in paragraphs [0075] to [0111] of the specification. As shown in FIG. 1A to FIG. 1D in CN102194893A, a thin film transistor in which a metal thin film of indium formed on a gate insulating layer 403 and an oxide semiconductor layer (a first In—Ga—Zn—O based non-single-crystal film serving as the oxide semiconductor layer) disposed on the metal thin film of indium are subjected to heat treatment, so as to form a stack of indium oxide and the oxide semiconductor layer (a first In—Ga—Zn—O based non-single-crystal film serving as the oxide semiconductor layer), on the indium oxide, for functioning as a channel forming region. For example, it is preferable that, from 200° C. to 600° C., usually 300° C. to 500° C., a heat treatment (which may be an annealing treatment with light illumination) is performed. The heat treatment is performed for 1 hour under the atmosphere of nitrogen gas at 350° C. in a furnace. The heat treatment is an oxidizing treatment in which a metal thin film 470 is oxidized partially or wholly. The metal thin film 470 is modified to be an indium oxide film, and then a first oxide semiconductor layer 471 that forms a stack functions as a channel forming region.

Figure 1B:
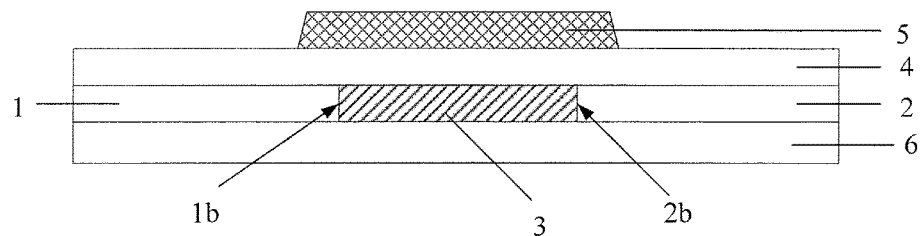
FIG. 1b is a second schematic view illustrating a thin film transistor according to an embodiment of the invention.

According to an embodiment of the present invention, there is provided a thin film transistor, as shown in FIG. 1a and FIG. 1b, which includes a source electrode 1, a drain electrode 2 and an active layer 3. The source electrode 1, the drain electrode 2 and the active layer 3 are disposed in the same layer, the source electrode 1 and the drain electrode 2 are separately joined to the active layer 3 through their respective side faces 1b and 2b, the material of the source electrode 1 and the drain electrode 2 is metal, and the semiconductor material of the active layer 3 is a metal oxide semiconductor in correspondence with the metallic material of the source electrode 1 and the drain electrode 2.

For example, the source electrode 1, the drain electrode 2 and the active layer 3 are prepared by the same layer of a metal thin film, and the metal oxide semiconductor is obtained by oxidizing the metal thin film. For example, the source electrode 1, the drain electrode 2 and the active layer 3 have surfaces that are substantially flush with each other, and the structure obtained thereby can have a flat morphology.

For example, when the metallic material of the source electrode 1 and the drain electrode 2 is selected, it should be noted that the material must be able to be formed into an oxide semiconductor by a subsequent process. For example, the metal may be a monolayer or a stack of any one or more of the metals selected from the group consisting of indium, gallium, zinc, tin, molybdenum, tungsten or the like or any alloy thereof.

For example, the source electrode 1, the drain electrode 2 and the active layer 3 arranged in the same layer may be directly disposed on a substrate 6, or disposed on the substrate 6 through a middle layer such as a buffer layer.

For example, the thin film transistor further includes a gate electrode 5 and a gate insulating layer 4, and the thin film transistor may be a bottom-gate construction. As shown in FIG. 1a, the gate electrode 5 is disposed on the substrate 6, the gate insulating layer 4 is disposed on the gate electrode 5, and the source electrode 1, the drain electrode 2 and the active layer 3 arranged in the same layer are disposed on the gate insulating layer 4.

For example, the thin film transistor may be a top-gate construction as well. As shown in FIG. 1b, the source electrode 1, the drain electrode 2 and the active layer 3 arranged in the same layer are disposed on the substrate 6, the gate insulating layer is disposed on the source electrode 1, the drain electrode 2 and the active layer 3, and the gate electrode 5 is disposed over the gate insulating layer 4.

According to an embodiment of the invention, there is further provided a manufacturing method of a thin film transistor. As shown in FIGS. 2a to 2d, the method includes a step of forming a source electrode 1, a drain electrode 2 and an active layer 3 lying in the same layer; an example of the step of forming the source electrode 1, the drain electrode 2 and the active layer 3 lying in the same layer includes:

step S1): forming a metal thin film 30;

step S2): forming a pattern 30a of a source electrode, a drain electrode and an active layer by the metal thin film 30;

step S3): forming a stop layer to cover a source region 1a and a drain region 2a, and to expose an active layer region 3a;

step S4): modifying part or all of the metal in the active layer region 3a into a metal oxide semiconductor, and removing the stop layer on the source region 1a and the drain region 2a, eventually forming the source electrode 1, the drain electrode 2 and the active layer 3.

The resultant source electrode 1 and drain electrode 2 are separated by the active layer 3, so that they are insulated from each other in a cut-off state of the fabricated thin film transistor.

With the stop layer being provided, a source region and a drain region that are covered by the stop layer can be prevented from being oxidized.

For example, the material of the metal thin film may be a monolayer or a stack of any one or more of the metals selected from the group consisting of indium, gallium, zinc, tin, molybdenum, tungsten or the like or any alloy thereof. When the material of the source electrode 1 and the drain electrode 2 is selected, it should be noted that the material must be able to be formed into an oxide semiconductor by a subsequent process.

For example, the metal thin film may be formed by a sputtering method, a vacuum vapor deposition method or a coating method. For example, the thickness of the metal thin film is larger than 0 and smaller than or equal to 10 nm, and for example, it may be in the range of 3 to 5 nm.

For example, it is possible that the pattern 30a of the source electrode, the drain electrode and the active layer is formed by the metal thin film 30 by using the same one patterning process in the step S2).

For example, when part or all of metal in the active layer region is turned into the metal oxide semiconductor, a layer of photoresist may be used as the stop layer to cover the source region and the drain region. Certainly, it is also possible that other material usable for preventing the metal from turning into a metal oxide, such as, silicon oxide, silicon nitride or other inorganic material, or resin or other organic material, is used as the stop layer.

For example, the process of turning part of all of metal in the active layer region into a metal oxide semiconductor may be conducted by means of heat treatment, but is not limited to heat treatment, and other method may also be adopted if the metal can be turned into a metal oxide semiconductor with the method.

For example, the heat treatment is conducted under an oxygen atmosphere. Further, the heat treatment mode may be conducted as follows: the heat treatment may be carried out under an oxygen gas atmosphere, or the heat treatment may be carried out under an oxygen-containing nitrogen gas or inert gas (rare gas, the same below) atmosphere. For example, argon gas or the like may be used as the inert gas (rare gas).

For example, temperature, time (period), and other process parameters of the heat treatment may be determined according to the stop layer used for covering the source region and the drain region. For example, the temperature of the heat treatment is lower than the thermal performance (e.g., heat-resisting temperature, etc., the same below) of the stop layer that covers the source region and the drain region, and the stop layer that covers the source region and the drain region can possess a better adhesion upon heat treatment, and can cover the source region and the drain region favorably, so that the regions are not oxidized.

For example, in the step S1) in the above method, the metal thin film 30 is directly formed on the substrate 6 or formed on the substrate 6 through a middle layer such as a buffer layer or the like.

For example, in a sputtering method, with the use of a light-shading mask whose zone except for a desired zone is covered, the metal thin film 30 may be merely formed in the desired zone.

For example, when photoresist is used as the stop layer for covering the source region and the drain region, a Half-tone mask or Gray-tone mask may be used to simultaneously form a pattern 30a of a source electrode, a drain electrode and an active layer and to distinguish a source region 1a and a drain region 2a that are required to be covered and an active layer region 3a that is required to be exposed (namely, distinguish an area required to be oxidized and an area not required to be oxidized).

Hereinafter, specific embodiments of the thin film transistor and manufacturing method thereof will be given with reference to FIGS. 2a to 2d.

Embodiment 1

Figure 2A:
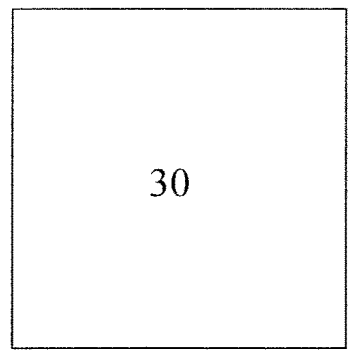
FIG. 2a to FIG. 2d are schematic views 1 (top views) illustrating steps of manufacturing a thin film transistor according to an embodiment of the invention.

As shown in FIGS. 2a to 2d, the manufacturing method of the thin film transistor includes a step of forming a source electrode, a drain electrode and an active layer lying in the same layer; the step of forming the source electrode, the drain electrode and the active layer lying in the same layer includes the following:

Step S1); a metal thin film 30 is formed, as shown in FIG. 2*a*.

For example, the material of the metal thin film may be a monolayer or a stack of any one or more of the metals selected from the group consisting of indium, gallium, zinc, tin, molybdenum, tungsten or the like or any alloy thereof. In the present embodiment, an In—Ga—Zn (IGZ) metal thin film will be given as an example. For example, it is possible that the In—Ga—Zn metal thin film is formed by a sputtering method with the use of a metal target containing In, Ga and Zn. For example, the thickness of the metal thin film is larger than 0 and smaller than or equal to 10 nm, and for example, it may be in the range of 3 to 5 nm.

For example, the metal thin film 30 is formed on a substrate 6. A number of intermediate elements may be provided between the metal thin film 30 and the substrate 6. For example, the metal thin film 30 may be formed on a gate insulating layer 4 or formed on the substrate with a layer of silicon nitride (SiNx) thin film and/or silicon dioxide ($SiO_2$) thin film being deposited on its surface to serve as a stop layer, but the forming position of the metal thin film 30 is not limited thereto.

For example, the substrate 6 is a transparent, insulating substrate, and it may be a glass substrate or quartz substrate, or of other suitable material.

Figure 2B:
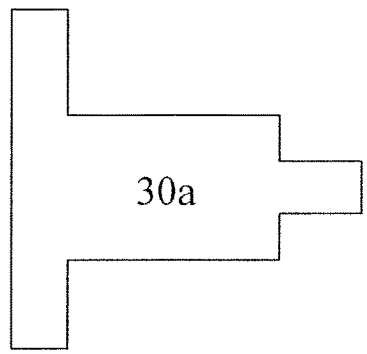

Step S2): a pattern 30*a* of a source electrode, a drain electrode and an active layer is formed by the metal thin film 30 at the same time, as shown in FIG. 2*b*.

For example, it is possible that a photoresist pattern is formed on the metal thin film 30 to serve as an etching mask, and then the metal thin film on which the photoresist pattern has been formed is subjected to an etching process, so as to simultaneously form the pattern 3*a* of the source electrode, the drain electrode and the active layer.

For example, a dry etching or wet etching process may be used for etching.

Alternatively, it is possible that a sputtering method, with a light-shading mask whose zone except for a desired zone is covered, is used to merely form the metal thin film in the desired zone.

For example, a photoresist pattern is formed on a substrate 6 with a buffer layer deposited on its surface or on a gate insulating layer 4 is formed, the photoresist pattern which corresponds to a zone other than the zone in which a pattern 30*a* of a source electrode, a drain electrode and an active layer is formed; a metal thin film 30 is formed by a sputtering method, the photoresist and the metal thin film on the photoresist are removed, and the pattern 30*a* of the source electrode, the drain electrode and the active layer can be thus formed.

Figure 2C:
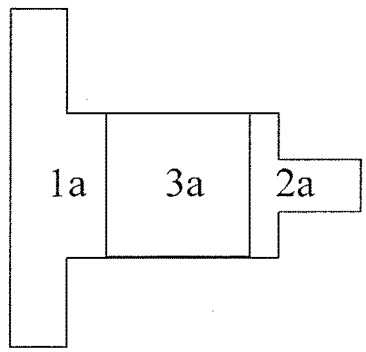

Step S3): a stop layer is formed to cover a source region 1*a* and a drain region 2*a*, and to expose an active layer region 3*a*, as shown in FIG. 2*c*.

Figure 2D:
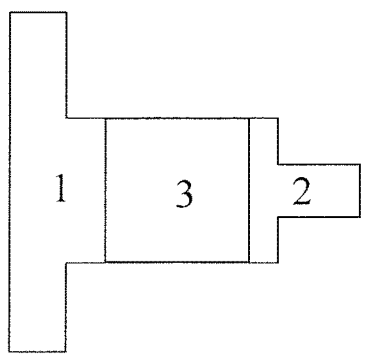

For example, a photoresist pattern is formed on the pattern 30*a* of the source electrode, the drain electrode and the active layer to serve as a stop layer, the photoresist in the active layer region 3*a* is removed by development and the underlying metal layer is exposed, and the source region 1*a* and the drain region 2*a* are still covered by the photoresist;

Step S4): part of all of the metal in the active layer region 3*a* is modified into a metal oxide semiconductor, and then the photoresist is stripped off. Namely, the stop layer that covers the source region 1*a* and the drain region 2*a* is removed, and a source electrode 1, a drain electrode 2 and an active layer 3 are ultimately formed, as shown in FIG. 2*d*.

For example, part or all of the metal in the active layer region may be modified into a metal oxide semiconductor by means of heat treatment, so that IGZ is converted into a metal oxide semiconductor IGZO. However, the converting treatment is not limited to heat treatment, other method may also be adopted if the metal can be converted into a metal oxide semiconductor by the method.

For example, the heat treatment is conducted under an oxygen atmosphere. Further, the heat treatment method may be as follows: the heat treatment may be carried out under an oxygen gas atmosphere, and the heat treatment may also be carried out under a nitrogen gas or inert gas atmosphere, which contains oxygen gas. For example, the heat treatment may be carried out under an argon gas atmosphere, which contains oxygen gas.

For example, the temperature of the heat treatment may be in the range of 80 to 250° C., and for example, it may be in the range of 100 to 150° C. The time may be in the range of 0.5 to 2 h, and for example, it may be in the range of 0.5 to 1 h. The temperature and the time of heat treatment here are merely illustrative examples, and the temperature, time and other process parameters of the heat treatment can be determined according to the stop layer used for covering a source region and a drain region. For example, the temperature of the heat treatment is lower than the thermal performance of the stop layer that covers the source region and the drain region, and the stop layer that covers the source region and the drain region can possess a better adhesion upon heat treatment and can cover the source region and the drain region favorably as long as the regions are not oxidized.

For example, the manufacturing method of the thin film transistor further include steps of forming a gate electrode 5 and a gate insulating layer 4.

For example, the thin film transistor may be a bottom-gate construction. As shown in FIG. 1*a*, the gate electrode 5 is disposed on the substrate 6, the gate insulating layer 4 is disposed on the gate electrode 5, and the source electrode 1, the drain electrode 2 and the active layer 3 arranged in the same layer are disposed on the gate insulating layer 4.

For example, the thin film transistor may be a top-gate construction as well. As shown in FIG. 1*b*, the source electrode 1, the drain electrode 2 and the active layer 3 arranged in the same layer are disposed on the substrate 6, the gate insulating layer 4 is disposed on the source electrode 1, the drain electrode 2 and the active layer 3, and the gate electrode 5 is disposed over the gate insulating layer 4.

For example, the gate electrode 5 may be a single-layered structure formed of any one selected from the group consisting of molybdenum (Mo), alloy of molybdenum and niobium, aluminum (Al), alloy of aluminum and neodymium (AlNd), titanium (Ti) and copper (Cu) or a laminated structure formed of several ones among the metals, or a laminated structure obtained in such a way that its sublayers are formed of molybdenum/aluminum/molybdenum (Mo/Al/Mo) or titanium/aluminum/titanium (Ti/Al/Ti). For example, the thickness range of the gate electrode 5 may be 200 nm to 500 nm.

For example, the gate insulating layer 4 may be formed of a transparent material, and for example, silicon oxide, silicon nitride (SiNx), hafnium oxide, silicon oxynitride, aluminum oxide or the like may be adopted.

Hereinafter, with the structure of the thin film transistor shown in FIG. 1*a* as an example, the manufacturing method of the thin film transistor in the embodiment will be described with reference to FIGS. 3*a* to 3*d*.

Embodiment 2

Figure 3A:
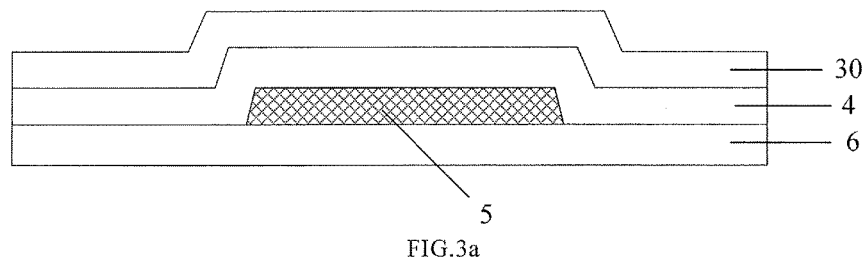
FIG. 3a to FIG. 3d are schematic views 2 (sectional views) illustrating steps of manufacturing a thin film transistor according to an embodiment of the invention.

As shown in FIGS. 3a to 3d, the manufacturing method of the thin film transistor includes a step of forming a source electrode, a drain electrode and an active layer lying in the same layer. Firstly, a gate thin film (e.g., a metal thin film of aluminum or an alloy of aluminum) is formed on a substrate, and formed into a gate line and a gate electrode 5 through a patterning process; next, a gate insulating layer 4 is formed on the gate line and the gate electrode 5 by a chemical vapor deposition or other process, then, a source electrode 1, a drain electrode 2 and an active layer 3 lying in the same layer are formed, and this step is such as carried out as follows:

Step S1): a metal thin film 30 is formed on the gate insulating layer 4, as shown in FIG. 3a.

The material of the metal thin film may be a monolayer or a stack of any one or more of metals selected from the group consisting of indium, gallium, zinc, tin, molybdenum or tungsten or of any alloy thereof. In the present embodiment, a metal thin film of In is given as an example.

For example, it is possible that the metal thin film of In is formed by way of sputtering with a metal target of In. For example, the thickness of the metal thin film is larger than 0 and smaller than or equal to 10 nm, and for example, it may be in the range of 3 to 5 nm.

Step S2): a pattern of a source electrode, a drain electrode and an active layer is formed by the metal thin film 30 with the same patterning process.

Figure 3B:
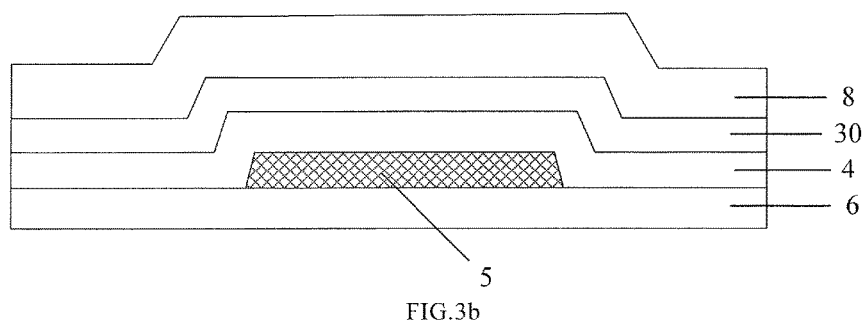
Figure 3C:
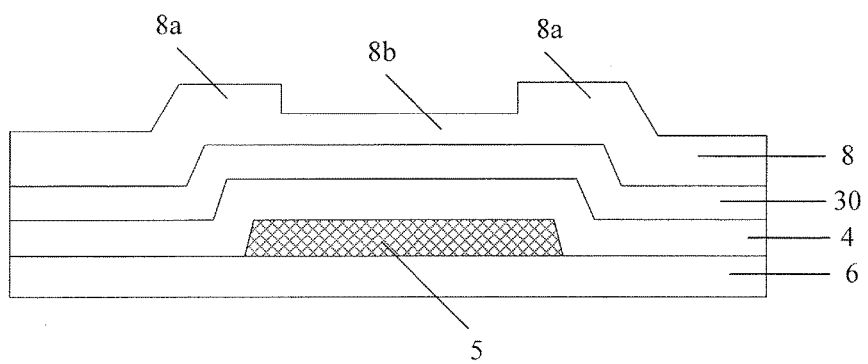

For example, a layer of photoresist 8 is formed on the metal thin film, and for example, a positive photoresist may be used. As shown in FIG. 3b, exposure and development are conducted on the photoresist by using a dual-tone mask process. In a half-tone mask used in the dual-tone mask process, zones (a source region 1a and a drain region 2a) corresponding to regions where a source electrode and a drain electrode are to be formed are light-proof zones, and a zone (an active layer region 3a) corresponding to a region where an active layer is to be formed is partially transmissive zone, and other zone is fully transmissive zone. After the exposure and development process, the thickness of a photoresist 8a corresponding to the regions where the source electrode and the drain electrode are to be formed is larger than the thickness of a photoresist 8b corresponding to the region where the active layer is to be formed, and as shown in FIG. 3c, the photoresist in other region is fully removed.

Afterwards, the metal thin film with a photoresist pattern formed thereon is etched, thereby forming a pattern 30a of the source electrode, the drain electrode and the active layer simultaneously.

Figure 3D:
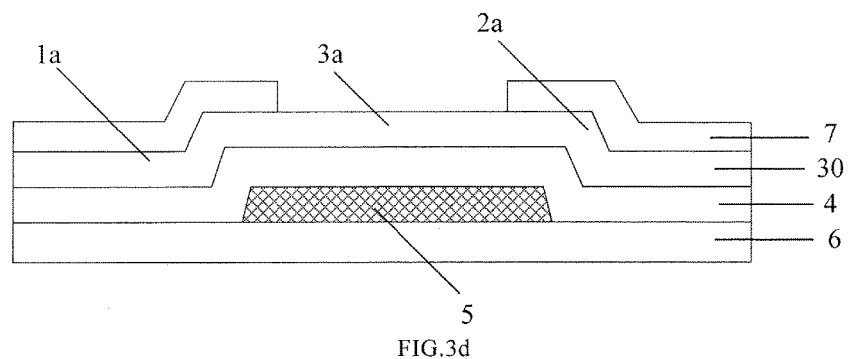

Step S3): a stop layer is formed to still cover a source region 1a and a drain region 2a, and to expose an active layer region 3a, as shown in FIG. 3d.

For example, a photoresist layer with a smaller thickness is removed by an aching process, so as to expose the metal thin film in the active layer region 3a; the source region 1a and the drain region 2a are covered by the photoresist layer serving as the stop layer 7. As mentioned above, the material that is usable as the stop layer is not limited to photoresist.

Step S4): part or all of the metal in the active layer region 3a is converted into a metal oxide semiconductor, and then the remaining photoresist is stripped off, namely, the stop layer on the source region 1a and the drain region 2a is removed, eventually forming the source electrode 1, the drain electrode 2 and the active layer 3, as shown in FIG. 1a. The source electrode 1 and drain electrode 2 are separated by the active layer 3 located between them.

For example, conversion of part of all of metal in the active layer region into a metal oxide semiconductor may be conducted by means of heat treatment, so as to convert In into a metal oxide semiconductor $In_2O_3$, but it is not limited to heat treatment. Other method may also be adopted if the metal can be turned into a metal oxide semiconductor by the method.

For example, the heat treatment is conducted under an oxygen atmosphere. Further, the heat treatment method may be as follows: the heat treatment may be carried out under an oxygen gas atmosphere, and the heat treatment may also be carried out under a nitrogen gas or inert gas atmosphere, which contains oxygen gas. For example, the heat treatment may be conducted under a nitrogen gas or argon gas atmosphere, which contains oxygen gas.

For example, the temperature, time and other process parameters of the heat treatment may be determined according to the stop layer useful for covering the source region and the drain region. For example, the temperature of the heat treatment is lower than the thermal performance of the stop layer that covers the source region and the drain region, and the stop layer that covers the source region and the drain region can possess a better adhesion upon heat treatment, and can cover the source region and the drain region favorably, as long as the regions are not oxidized.

According to another embodiment of the invention, there is further provided an array substrate, which includes the thin film transistor as stated in any of above-mentioned embodiments.

Figure 4A:
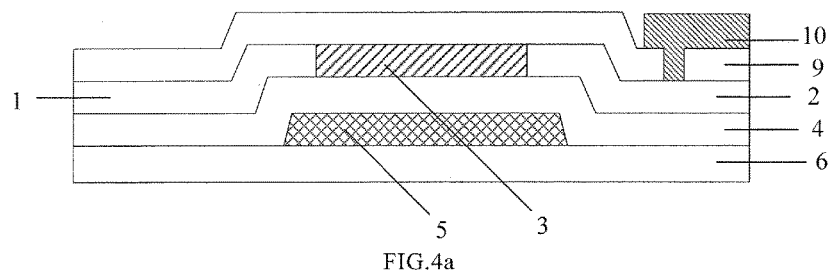
FIG. 4a is a first schematic view illustrating an array substrate according to an embodiment of the invention.
Figure 4B:
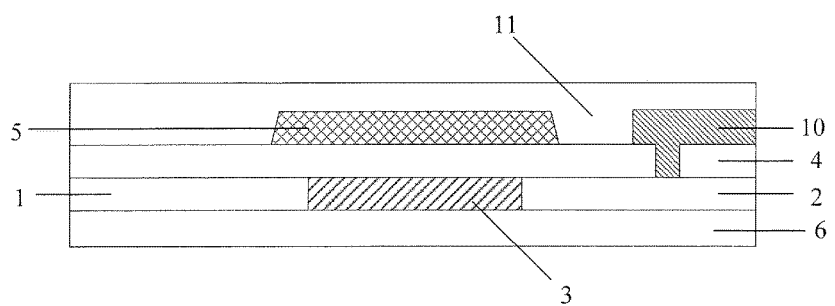
FIG. 4b is a second schematic view illustrating an array substrate according to an embodiment of the invention.

The array substrate according to the embodiment of the invention includes a plurality of gate lines and a plurality of data lines, and these gate lines and data lines cross over each other to thereby define pixel units arranged in a matrix form, each of which includes a thin film transistor functioning as a switch element and a pixel electrode, and the thin film transistor is any thin film transistor obtained in above-mentioned embodiments. As shown in FIG. 4a and FIG. 4b, the array substrate includes a pixel electrode 10, a passivation layer 9, a protective layer 11 and so on. The pixel electrode 10, for example, may be made of a transparent conductive material, and for example, it may be made of any one of transparent conductive materials selected from the group consisting of indium tin oxide (ITO), indium zinc oxide, indium gallium zinc oxide, indium gallium tin oxide and so on. For example, regarding the thin film transistor of each of pixels, its gate electrode is electrically connected to or integrally formed with a corresponding gate line, its source electrode is electrically connected to or integrally formed with a corresponding data line, and its drain electrode is electrically connected to or integrally formed with a corresponding pixel electrode. For example, the passivation layer 9 and the protective layer 11 may be formed of a transparent material, and for example, silicon oxide, silicon nitride (SiNx), hafnium oxide, silicon oxynitride, aluminum oxide or the like may be used.

According to another embodiment of the invention, there is further provided a display device, which includes the array substrate in any of the above-mentioned embodiments.

An example of the display device is a liquid crystal display device, in which, an array substrate and a counter substrate are disposed opposite to each other to form a liquid crystal cell with a liquid crystal material filled therein. The counter substrate is such as a color filter substrate. The pixel electrode of each of pixel units of the array substrate acts to apply an electric field for control of the rotation degree of the liquid crystal material so as to perform a display operation.

In some examples, the liquid crystal display device further includes a backlight source for providing the array substrate with backlight.

Another example of the display device is an organic light emitting diode (OLED) device, in which, a stack of an organic light emitting material is formed on an array substrate, and a pixel electrode of each of pixel units serves as an anode or a cathode for driving the organic light emitting material to give off light so as to perform a display operation.

Still another example of the display device is an electronic paper display device. For example, an electronic ink layer is formed on an array substrate, and a pixel electrode of each of pixel units, which serves as one of electrodes for producing an electric field, act to apply a voltage for driving charged microparticles in the electronic ink to move so as to perform a display operation.

A channel area is defined by a gap between the source electrode and the drain electrode, and various embodiments of the invention have been described by taking a thin film transistor with a rectangular channel as an example. However, the shape of the channel is not limited thereto. Rather, a thin film transistor of other type may be used as well. For example, a thin film transistor with a U-shaped channel may also be used.

A thin film transistor provided by any embodiment of the invention includes a source electrode, a drain electrode and an active layer; the source electrode, the drain electrode and the active layer are disposed in the same layer, the source electrode and the drain electrode are separately joined to the active layer through their respective side faces, the material of the source electrode and the drain electrode is metal, and the material of the active layer is a metal oxide semiconductor in correspondence with the material of the source electrode and the drain electrode. When the thin film transistor is fabricated, a metal thin film is formed, and by using the same one patterning process, a pattern of a source electrode, a drain electrode and an active layer is formed by the metal thin film simultaneously; a stop layer is formed to cover a source region and a drain region, and to expose an active layer region; part or all of the metal in the active layer region is converted into a metal oxide semiconductor, and the stop layer in the source region and the drain region is removed, eventually forming the source electrode, the drain electrode and the active layer. With the thin film transistor and manufacturing method thereof provided by embodiments of the invention, the number of film coating processes, the number of etching processes and the number of masking processes can be decreased. Consequently, procedures can be decreased, and the cost is reduced.

In the manufacturing method according to embodiments of the invention, in the event that a half-tone or gray-tone mask manner is adopted to simultaneously form a pattern of a source electrode, a drain electrode and an active layer and to distinguish a source region and a drain region that are required to be covered and an active layer region that is required to be exposed, the number of masking processes can be further decreased, thereby decreasing the procedures and reducing the cost.

As regards the array substrate and the corresponding display device provided by embodiments of the invention, owing to the fact that they include a thin film transistor provided by embodiments of the invention, the number of film coating processes, the number of etching processes and the number of masking processes upon manufacture can be decreased. Consequently, the procedures can be decreased, and the cost is reduced.

Descriptions made above are merely specific embodiments of the present invention, but the protection scope of the invention is not limited thereto. Changes or replacements, as easily conceivable by those skilled in the art within the technical scope disclosed by the invention, shall be encompassed within the protection scope of the invention. Therefore, the protection scope of the invention shall be determined by the protection scope of attached claims.

This patent application claims the benefit of priority from Chinese patent application No. 201510054532.8 filed on Feb. 2, 2015, the disclosure of which is incorporated herein in its entirety by reference as a part of the present application.

What is claimed is:

1. A manufacturing method of a thin film transistor, comprising a step of forming a source electrode, a drain electrode and an active layer in a same layer,
wherein the step of forming the source electrode, the drain electrode and the active layer lying in the same layer includes:
forming a metal thin film;
forming a pattern of the source electrode, the drain electrode and the active layer by a metal thin film;
forming a stop layer to cover a source region and a drain region, and to expose an active layer region; and
converting part or all of the metal thin film in the active layer region into a metal oxide semiconductor, and removing the stop layer in the source region and the drain region, thereby forming the source electrode, the drain electrode and the active layer eventually.

2. The manufacturing method of the thin film transistor claimed as claim 1, wherein a material of the metal thin film is a monolayer or a stack of any one or more of metals selected from the group consisting of indium, gallium, zinc, ti molybdenum or tungsten or any alloy thereof.

3. The manufacturing method of the thin film transistor claimed as claim 1, wherein the pattern of the source electrode, the drain electrode and the active layer is formed by the metal thin film with a same one patterning process.

4. The manufacturing method of the thin film transistor claimed as claim 1, wherein photoresist is used for the stop layer.

5. The manufacturing method of the thin film transistor claimed as claim 1, wherein photoresist is used for the stop layer, and a half-tone or gray-tone mask manner is adopted to simultaneously form the pattern of the source electrode, the drain electrode and the active layer and to distinguish the source region and the drain region that are required to be covered and the active layer region that is required to be exposed.

6. The manufacturing method of the thin film transistor claimed as claim 1, wherein part of all of the metal in the active layer region is converted into a metal oxide semiconductor by way of heat treatment.

7. The manufacturing method of the thin film transistor claimed as claim 6, wherein the heat treatment is carried out under an oxygen atmosphere.

8. The manufacturing method of the thin film transistor claimed as claim 6, wherein the heat treatment is carried out under an oxygen gas atmosphere, or carried out under a nitrogen gas or inert gas atmosphere, which contains oxygen gas.

9. The manufacturing method of the thin film transistor claimed as claim 1, further comprising steps of forming a gate electrode and a gate insulating layer.

* * * * *